(12) United States Patent
Lehner

(10) Patent No.: US 10,710,210 B2
(45) Date of Patent: Jul. 14, 2020

(54) METHOD FOR FORMING SEMICONDUCTOR DEVICES

(71) Applicant: Infineon Technologies AG, Neubiberg (DE)

(72) Inventor: Rudolf Lehner, Laaber (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/424,595

(22) Filed: May 29, 2019

(65) Prior Publication Data

US 2019/0275638 A1 Sep. 12, 2019

Related U.S. Application Data

(62) Division of application No. 15/655,477, filed on Jul. 20, 2017, now Pat. No. 10,307,884.

(30) Foreign Application Priority Data

Jul. 21, 2016 (DE) .................. 10 2016 113 500

(51) Int. Cl.
*H01L 21/304* (2006.01)
*B24B 49/16* (2006.01)
(Continued)

(52) U.S. Cl.
CPC ............ *B24B 49/16* (2013.01); *B24B 49/006* (2013.01); *B24B 51/00* (2013.01); *H01L 21/304* (2013.01);
(Continued)

(58) Field of Classification Search
CPC ............ H01L 21/02013; H01L 21/304; H01L 21/463; H01L 21/67092; H01L 21/67253; H01L 21/6835; H01L 21/784; H01L 21/8213; H01L 29/66053; H01L 2221/68327; B24B 7/07; B24B 7/075; B24B 7/228; B24B 49/006; B24B 49/04; B24B 49/045; B24B 49/06; B24B 51/00
See application file for complete search history.

(56) References Cited

U.S. PATENT DOCUMENTS 5,827,112 A 10/1998 Ball
6,146,241 A 11/2000 Lee et al.
(Continued)

FOREIGN PATENT DOCUMENTS

CN 104117904 A 10/2014

*Primary Examiner* — Stephen W Smoot
(74) *Attorney, Agent, or Firm* — Murphy, Bilak & Homiller, PLLC

(57) ABSTRACT

A method for forming semiconductor devices includes: grinding a backside of a semiconductor wafer with a grinding wheel during a first time interval, wherein the grinding wheel is forward moved during the first time interval, wherein a plurality of semiconductor devices are formed on the semiconductor wafer; polishing the backside of the semiconductor wafer with the grinding wheel in a second time interval, wherein the grinding wheel is backward moved during the second time interval; and dicing the semiconductor wafer to separate the plurality of semiconductor devices from each other without additional polishing of the backside of the semiconductor wafer before dicing the semiconductor wafer.

20 Claims, 3 Drawing Sheets

(51) Int. Cl.
*H01L 21/463* (2006.01)
*B24B 51/00* (2006.01)
*H01L 21/82* (2006.01)
*H01L 29/66* (2006.01)
*B24B 49/00* (2012.01)
*H01L 21/67* (2006.01)
*H01L 21/683* (2006.01)
*H01L 21/78* (2006.01)
*H01L 29/16* (2006.01)

(52) U.S. Cl.
CPC ...... *H01L 21/463* (2013.01); *H01L 21/67092* (2013.01); *H01L 21/67253* (2013.01); *H01L 21/6835* (2013.01); *H01L 21/78* (2013.01); *H01L 21/8213* (2013.01); *H01L 29/1608* (2013.01); *H01L 29/66053* (2013.01); *H01L 2221/68327* (2013.01)

(56) References Cited

U.S. PATENT DOCUMENTS

| | | | |
|---|---|---|---|
| 6,406,357 B1 * | 6/2002 | Kazui | B24B 37/042 451/41 |
| 6,520,835 B1 | 2/2003 | Sato et al. | |
| 6,602,121 B1 | 8/2003 | Halley | |
| 2005/0142987 A1 | 6/2005 | Kramer et al. | |
| 2005/0197048 A1 | 9/2005 | Li et al. | |
| 2006/0040586 A1 | 2/2006 | Arai | |
| 2007/0227655 A1 * | 10/2007 | Kajiyama | H01L 21/3043 156/345.11 |
| 2008/0274670 A1 | 11/2008 | Tada et al. | |
| 2014/0106647 A1 | 4/2014 | Kang et al. | |
| 2015/0371912 A1 | 12/2015 | Bello et al. | |
| 2016/0240446 A1 | 8/2016 | Matsuda et al. | |

* cited by examiner

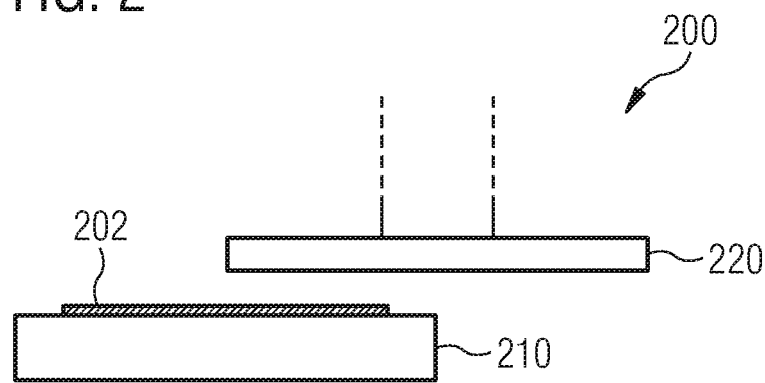
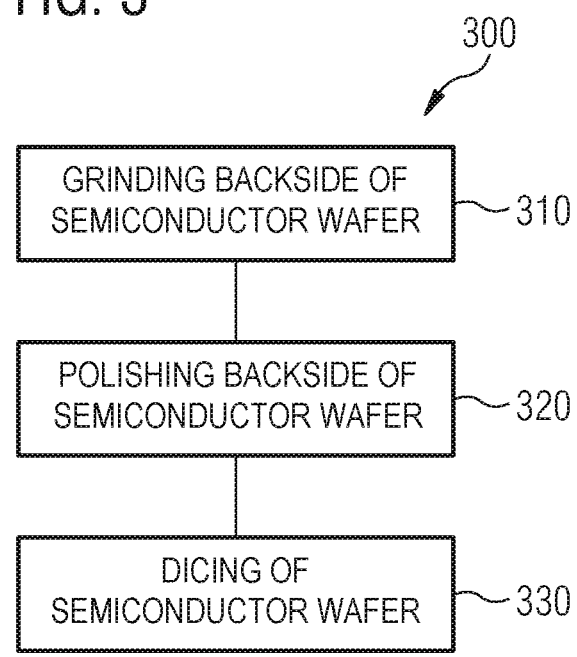

METHOD FOR FORMING SEMICONDUCTOR DEVICES

TECHNICAL FIELD

Embodiments relate to concepts for grinding semiconductor wafers, and in particular to an apparatus for controlling a movement of a grinding wheel, a semiconductor wafer grinding system and a method for forming semiconductor devices.

BACKGROUND

Grinding of semiconductor wafers often is a necessary step in the production of semiconductor devices. For example, the grinding of a backside of the semiconductor wafer may enable a reduced thickness of the semiconductor devices, allowing for a higher density of devices during packaging or stacking and/or comprising a lower resistance for vertical currents.

SUMMARY

There may be a demand to provide an improved concept for a grinding of semiconductor wafers, which enables improving the accuracy and/or increasing the throughput and/or reducing costs of the grinding.

Some embodiments relate to an apparatus for controlling a movement of a grinding wheel of a semiconductor wafer grinding system. The apparatus comprises at least one interface configured to obtain a feedback signal comprising grinding force information indicating a force applied to a semiconductor wafer by the grinding wheel. The apparatus further comprises a control module configured to generate a control signal for controlling the movement of the grinding wheel based on the grinding force information. The control module is configured to generate the control signal to trigger a forward movement of the grinding wheel according to a desired velocity profile during grinding of the semiconductor wafer if the grinding force information indicates that a force applied by the grinding wheel is below a force threshold. The control module is configured to generate the control signal to trigger a movement of the grinding wheel slower than the desired velocity profile during grinding of the semiconductor wafer if the grinding force information indicates that the force applied by the grinding wheel is above the force threshold. The at least one interface is configured to provide the control signal for controlling a movement of the grinding wheel.

Some embodiments relate to a semiconductor wafer grinding system. The semiconductor wafer grinding system comprises a wafer carrier structure, configured to hold a semiconductor wafer. The semiconductor wafer grinding system further comprises a grinding wheel for grinding the semiconductor wafer. The grinding wheel comprises a grinding material structure comprising a plurality of grinding stones embedded in a bonding material. At least 80% of the grinding stones of the plurality of grinding stones comprise a diameter of more than 25 µm and the plurality of grinding stones occupy more than of 40% of the grinding material structure.

Some embodiments relate to a method for forming semiconductor devices. The method comprises grinding of a backside of a semiconductor wafer with a grinding wheel during a first time interval. The grinding wheel is forward moved during the first time interval. A plurality of semiconductor devices are formed on the semiconductor wafer. The method further comprises polishing of the backside of the semiconductor wafer with the grinding wheel in a second time interval. The grinding wheel is backward moved during the second time interval. The method further comprises dicing the semiconductor wafer to separate the plurality of semiconductor devices from each other without additional polishing of the backside of the semiconductor wafer before dicing the semiconductor wafer.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which:

FIG. 2 illustrates a schematic cross section of a semiconductor wafer grinding system; and FIG. 3 illustrates a flow chart of a method for forming semiconductor devices.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1A:
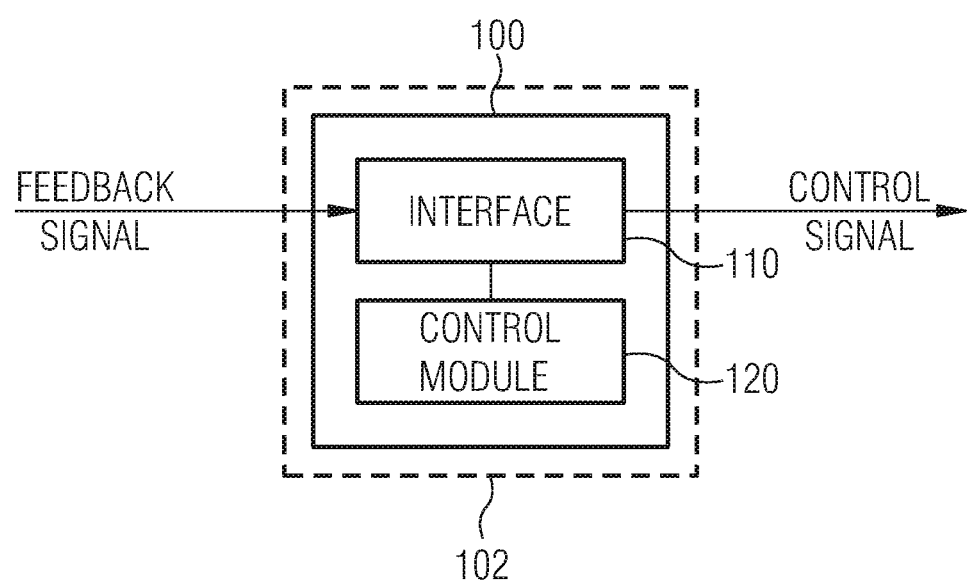
FIG. 1a illustrates a block diagram of an apparatus for controlling a movement of a grinding wheel of a semiconductor wafer grinding system.

FIG. 1a illustrates a block diagram of an apparatus 100 for controlling a movement of a grinding wheel of a semiconductor wafer grinding system 102. The apparatus comprises at least one interface 110 configured to obtain a feedback signal comprising grinding force information indicating a force applied to a semiconductor wafer by the grinding wheel. The apparatus further comprises a control module 120 configured to generate a control signal for controlling the movement of the grinding wheel based on the grinding force information. The control module 120 is configured to generate the control signal to trigger a forward movement of the grinding wheel according to a desired velocity profile during grinding of the semiconductor wafer if the grinding force information indicates that a force applied by the grinding wheel is below a force threshold. The control module 120 is configured to generate the control signal to trigger a movement of the grinding wheel slower than the desired velocity profile during grinding of the semiconductor wafer if the grinding force information indicates that the force applied by the grinding wheel is above the force threshold. The at least one interface 110 is configured to provide the control signal for controlling a movement of the grinding wheel, e.g. to the semiconductor wafer grinding system.

Using the feedback signal to adjust the grinding may enable adjusting the force applied to the semiconductor wafer, e.g. to improve an accuracy of the grinding of the semiconductor wafer, to increase a throughput of semiconductor wafers and/or to reduce costs of grinding semiconductor wafers For example, the movement of the grinding wheel may correspond to a movement of the grinding wheel towards the semiconductor wafer or away from the semiconductor wafer. For example, the movement of the grinding wheel may correspond to a vertical movement of the grinding wheel. The movement of the grinding wheel may correspond to a linear movement orthogonal to a (front-side or backside) surface of the semiconductor wafer, for example. For example, the forward movement of the grinding wheel may correspond to a continuous forward movement. For example, the forward movement may be a movement of the grinding wheel (vertically) towards the semiconductor wafer and a backward movement may be a movement of the grinding wheel (vertically) away from the semiconductor wafer.

Additionally, the grinding wheel may rotate with an adjustable rotation speed during grinding. The control module 120 may be configured to adjust the rotation speed based on the grinding force information, for example.

For example, the grinding force information may be based on a measurement of the force applied to the semiconductor wafer, e.g. at the semiconductor wafer or at a wafer carrier structure holding the semiconductor wafer or at the grinding wheel. Alternatively or additionally, the grinding force information may be based on measurements or values related (or proportional) to the force applied to the semiconductor wafer, e.g. a current of a (e.g. grinder spindle) motor driving the grinding wheel.

For example, the grinding force information may comprise information related to a motor current of a motor driving the grinding wheel. The motor current may be a useful and sufficiently precise indicator of a force applied to the semiconductor wafer. For example, the grinding force information may be represented by a current or voltage of the feedback signal proportional to the current of the motor driving the grinding wheel, or digital (bit) values indicating the motor current. For example, the control module 120 may be configured to generate the control signal to trigger a forward movement according to the desired velocity profile if the information related to the motor current indicates the motor current being below a current threshold, and to generate the control signal to trigger the movement slower than the desired velocity profile if the information related to the motor current indicates the motor current being above the current threshold. The current threshold may be between 80% and 90% of a maximum specified current of the semiconductor wafer grinding system, for example. For example, for a semiconductor wafer grinding system specified to a motor current of maximally 20 A, the current threshold may be between 16 A and 18 A. For example, for an embodiment having an idle current between 5 A and 10 A, the current threshold may be between 11 A and 16 A. For example, the current threshold may be at least 10% (or at least 20%) lower during a fine grinding or polishing of the semiconductor wafer than during a coarse grinding of the semiconductor wafer. For example, the current threshold may be less than twice an idle current of a semiconductor wafer grinding system during fine grinding of the semiconductor wafer, e.g. to avoid an increased removal of material from the semiconductor wafer. The current threshold may be an implementation of the force threshold.

Alternatively or additionally, the grinding force information may comprise information related to a pressure exerted from the grinding wheel to the semiconductor wafer, e.g. from a sensor measuring a pressure on the grinding wheel or from a sensor measuring a pressure on the wafer carrier structure. The information related to the pressure may enable a more precise deduction of the force applied to the wafer. For example, the information related to the pressure exerted from the grinding wheel to the semiconductor wafer may comprise a current, a voltage or digital (bit) values proportional to the pressure exerted from the grinding wheel to the semiconductor wafer. The force threshold may correspond to a threshold, above which a damage of the semiconductor wafer or a deactivation or overload of the semiconductor wafer grinding system is expected. For example, the force threshold may limit the pressure exerted on the semiconductor wafer. For example, the force threshold may correspond to a pressure threshold. For example, the force applied by the grinding wheel may comprise a vertical component, e.g. of the forward movement of the grinding wheel, and/or a lateral component, e.g. of a grinding rotation of the grinding wheel.

For example, the movement of the grinding wheel during grinding if the grinding force information indicates that the force applied by the grinding wheel is above the force threshold may correspond to a forward or backward movement. For example, the linear movement may be larger than zero during grinding, for example.

For example, the movement of the grinding wheel during grinding of the semiconductor wafer, if the grinding force information indicates that the force applied by the grinding wheel is above the force threshold, corresponds to a slower forward movement than indicated by the desired velocity profile. The slower forward movement may reduce the force applied by the grinding wheel and may help avoid a deactivation of the semiconductor wafer grinding system. For example, the movement of the grinding wheel during grinding of the semiconductor wafer if the grinding force information indicates that the force applied by the grinding wheel is above the force threshold may be at least 20% slower (or at least 25% slower, at least 30% slower, at least 50% slower, at least 80% slower) than the forward movement indicated by the desired velocity profile. Additionally, the movement of the grinding wheel during grinding of the semiconductor wafer, if the grinding force information indicates that the force applied by the grinding wheel is above the force threshold, may correspond to a backward movement. The control module 120 may be configured to generate the control signal to trigger a backward movement during grinding of the semiconductor wafer if the grinding force information indicates that the force applied by the grinding wheel is still above the force threshold after slowing. The backward movement may further reduce the force applied by the grinding wheel and may help to avoid a deactivation of the semiconductor wafer grinding system.

For example, the desired velocity profile may comprise one or more portions comprising one or more desired movement velocities. For example, the one or more desired velocities may be related to different phases or time periods of a wafer grinding processes. For example, a velocity of the forward movement may correspond to an (average, maximum or minimum) speed the grinding wheel is moved towards the semiconductor wafer. For example, the desired velocity profile may comprise one or more portions for grinding of the semiconductor wafer (grinding portions) and one or more portions for polishing of the semiconductor wafers (polishing portions). For example, the one or more grinding portions may comprise a desired movement velocity indicating a forward movement of the grinding wheel. The one or more polishing portions may comprise a desired movement velocity indicating a backward movement of the grinding wheel. The desired velocity profile may be stored in a memory unit connected to the control module, for example.

For example, the control module 120 may be configured to generate the control signal based on a target semiconductor wafer thickness for the semiconductor wafer. For example, the target semiconductor wafer thickness may be smaller than 200 µm (or smaller than 150 µm, smaller than 100 µm, smaller than 80 µm, smaller than 70 µm, smaller than 60 µm, smaller than 50 µm). For example, the target semiconductor wafer thickness may correspond to a desired average thickness of the semiconductor wafer after grinding, for example. For example, an average thickness of the semiconductor wafer after grinding and/or polishing may be within 10% (or within 8%, within 5%, within 3%, within 2%) of the target semiconductor wafer thickness. The desired velocity profile may be based on the target semiconductor wafer thickness. Using a desired velocity profile depending on the target semiconductor wafer (end) thickness may enable using different forward movement velocities for different time/progress periods during processing of the semiconductor wafer to reach. For example, the desired velocity profile may comprise two or more portions corresponding to the target end thickness and one or more intermediate target thicknesses of the semiconductor wafer for two or more processing time periods or time intervals.

For example, the desired velocity profile may comprise a first portion for grinding to a semiconductor wafer intermediate thickness and a second portion for grinding to the target semiconductor wafer end thickness. The control module 120 may be configured to generate the control signal to trigger a faster (forward) movement for the first portion of the desired velocity profile and to trigger a slower (forward) movement for the second portion of the desired velocity profile. For example, the target semiconductor wafer intermediate thickness may be larger than 80 µm (or larger than 100 µm, larger than 125 µm, larger than 150 µm). The target semiconductor wafer end thickness may be larger than 30 µm (or larger than 50 µm, larger than 60 µm, larger than 75 µm), for example. For example, the faster movement velocity may be at least 20% faster (or at least 25% faster, at least 50% faster, at least 75% faster) than the second slower forward velocity.

For example, the desired velocity profile may comprise a first portion with a velocity above an average profile velocity (of the desired velocity profile) for a coarse grinding towards the target semiconductor wafer thickness followed by a second portion with a velocity below an average profile velocity for a fine grinding towards the target semiconductor wafer thickness. This may enable a more thorough processing of a portion of the semiconductor wafer exposed after grinding or polishing. For example, the coarse grinding may reduce the semiconductor wafer to or towards the target semiconductor wafer intermediate thickness and the fine grinding may reduce the semiconductor wafer to or towards the target semiconductor wafer end thickness. For example, the velocity for the coarse grinding may be at least at least 25% faster (or at least 50% faster, at least 75% faster) than the velocity for the fine grinding, for example. For example, the velocity for the fine grinding may be at least 25% slower (or at least 50% slower, at least 75% slower) than the velocity for the coarse grinding. For example, the average profile velocity of the desired velocity profile may correspond to a (weighted) average of the velocity during the whole grinding or at least during the coarse grinding and the velocity for the fine grinding.

For example, a velocity used for coarse grinding may be between 0.15 µm/s and 1 µm/s. For example, an (average) velocity used for coarse grinding may be larger than 0.15 µm/s (or larger than 0.2 µm/s, larger than 0.4 µm/s). A velocity used for the fine grinding may be below 0.15 µm/s (e.g. lower than 0.12 µm/s, lower than 0.1 µm/s). For example, a rotation velocity of the semiconductor wafer may be lower than 150 rpm for the coarse grinding, higher than 150 rpm for the fine grinding, and higher than 200 rpm (or higher than 250 rpm) for the polishing. A backward velocity during polishing may be smaller than 0.05 µm/s. A rotation velocity of the grinding wheel may be between 1500 rpm and 3000 rpm, for example.

For example, the control module 120 may be configured to generate the control signal to trigger a backward movement of the grinding wheel after the target semiconductor wafer (end) thickness is reached. After the target semiconductor wafer is reached, a backward movement may enable a polishing of the semiconductor wafer. For example, the desired velocity profile may comprise a polishing portion after the target semiconductor wafer thickness is reached. The polishing portion may render an additional processing of the semiconductor wafer with a different grinding or polishing wheel unnecessary. For example, the polishing portions may comprise a movement velocity indicating a backward movement For example, the control module 120 may be configured to generate the control signal to trigger a polishing of the semiconductor wafer with the grinding wheel during (at least a part) of the backward movement, e.g. while the grinding wheel is in contact with the semiconductor wafer, e.g. due to an elasticity of a foil (layer) between the semiconductor wafer and the semiconductor carrier structure. The grinding wheel used for polishing is the same grinding wheel as used for grinding to the target (end) thickness of the semiconductor wafer, for example. The polishing step may render an additional polishing with a different grinding or polishing wheel unnecessary. For example, a velocity of the backward movement during polishing may be slower than 50% (or slower than 40%, slower than 30%, slower than 20%) of an average velocity of the desired velocity profile during grinding, which may enable using similar velocity presets for forward and backward moving. For example, after a backward movement of at least 3 µm, a current drawn may be less than 10% above an idle current of the semiconductor wafer grinding system, for example. If the current drawn after a backward movement of at least 3 µm is higher than 10% above the idle current of the semiconductor wafer grinding system, the backward movement may be adjusted.

For example, the grinding wheel may be a grinding wheel for grinding semiconductor wafers, e.g. silicon-based semiconductor wafers, silicon carbide-based semiconductor wafers or other wide band-gap semiconductor wafers, for example. For example, the grinding wheel may be implemented similar to a grinding wheel described in connection with FIG. 2. For example, the semiconductor wafer grinding system may comprise a wafer carrier structure (e.g. a chuck table) for holding the semiconductor wafer and a grinding wheel, for example. The apparatus 100 may be connected to the semiconductor wafer grinding system or may be part of the semiconductor wafer grinding system, for example. The semiconductor wafer grinding system may be implemented similar to a semiconductor wafer grinding system described in connection with FIG. 2.

For example, the feedback signal may comprise analog feedback information or digital feedback information. For example, the feedback signal may comprise a current, voltage or digital value substantially proportional (e.g. proportional within a deviation of 10% of the current, voltage or digital value) to the force applied to the semiconductor wafer. For example, the feedback signal may comprise (periodic) digital values representing the grinding force information. The feedback signal may comprise an electronic signal, an optical signal or a radio signal, for example.

For example, the control signal may comprise an analog control signal or digital control instructions For example, the control signal may comprise a current or voltage substantially proportional to the forward (or backward) movement velocity. For example, the control signal may comprise (periodic) digital values representing the control instructions, e.g. forward or backward movement velocity or direction. The feedback signal may comprise an electronic signal, an optical signal or a radio signal, for example.

The at least one interface 110 may correspond to one or more inputs and/or outputs for receiving and/or transmitting analog or digital signals. For example, the control module 120 may be implemented using one or more processing units, one or more processing devices, any means for processing, such as a processor, a computer or a programmable hardware component being operable with accordingly adapted software. In other words, the described function of the control module 120 may as well be implemented in software, which is then executed on one or more programmable hardware components. Such hardware components may comprise a general purpose processor, a Digital Signal Processor (DSP), a micro-controller, etc.

For example, a vertical direction and a vertical dimension or thicknesses may be measured orthogonal to a front side surface of the semiconductor wafer 102 and a lateral direction and lateral dimensions may be measured in parallel to the front side surface of the semiconductor wafer 102.

The front side of the semiconductor wafer may be the side used to implement more sophisticated and complex structures than at the backside of the semiconductor wafer, since the process parameters (e.g. temperature) and the handling may be limited for the backside, if structures are already formed at one side of the semiconductor wafer, for example.

More details and aspects of the apparatus 100 are mentioned in connection with the proposed concept or one or more examples described below (e.g. FIG. 2 or 3). The apparatus 100 may comprise one or more additional optional features corresponding to one or more aspects of the proposed concept or one or more examples described above or below.

Figure 1B:
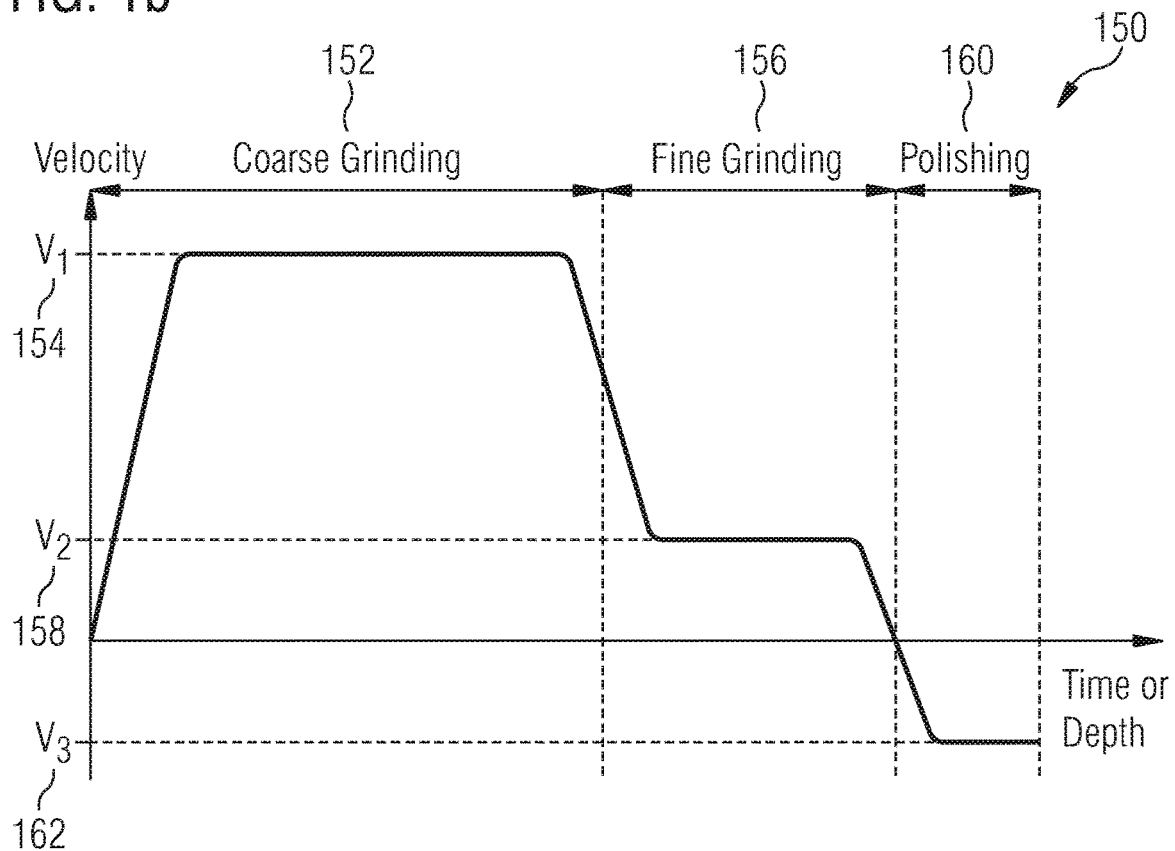
FIG. 1b illustrates a schematic diagram of a desired velocity profile.

FIG. 1b illustrates a schematic diagram 150 of a desired velocity profile indicating a linear movement velocity over time or grinding depth. The desired velocity profile comprises a coarse grinding portion 152 with a desired velocity $V_1$ 154, a fine grinding portion 156 with a desired velocity $V_2$ 148 and a polishing portion with a desired velocity $V_3$ 162. $V_2$ may be 25% of $V_1$, and $V_3$ may be −25% of $V_1$, for example.

Figure 1C:
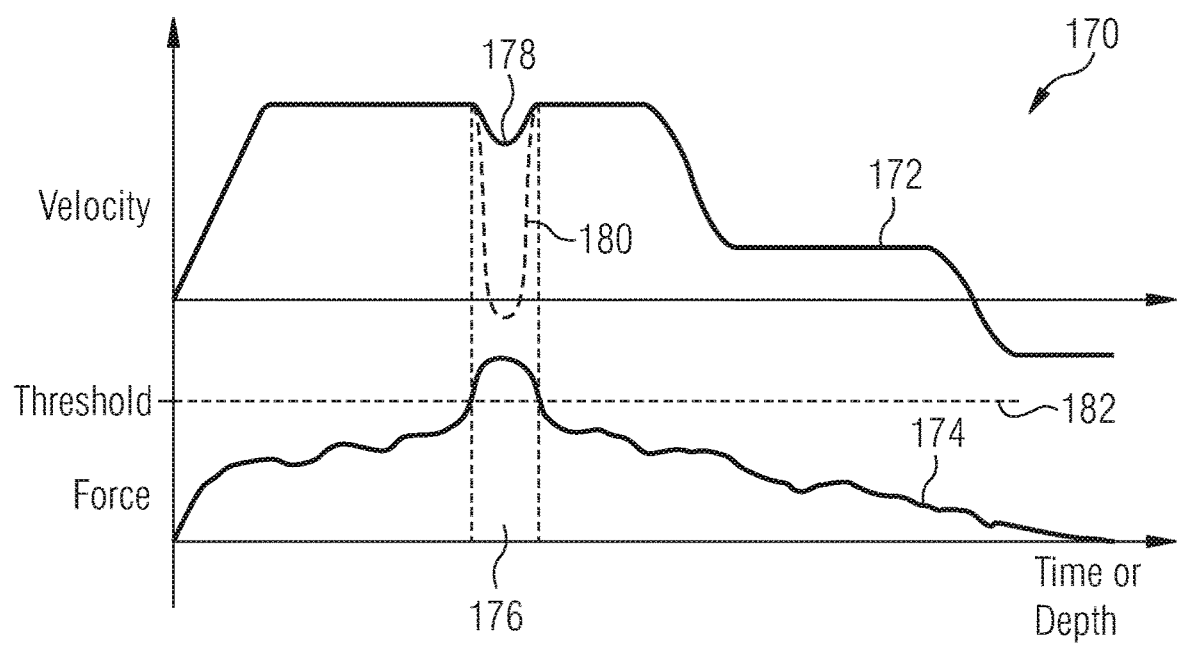
FIG. 1c illustrates a schematic diagram of a possible influence of the force applied to the semiconductor wafer on the velocity of the movement of the grinding wheel.

FIG. 1c illustrates a schematic diagram 170 of a velocity over time or grinding depth and a force over time or grinding depth, illustrating a possible influence of the force applied to the semiconductor wafer on the velocity of the movement of the grinding wheel as controlled by the control module in an embodiment. The schematic diagram comprises a first graph 172 of the velocity of the movement of the grinding wheel and a second graph 174 of the force applied to the semiconductor wafer as indicated by a feedback signal. As the force 174 surpasses a force threshold 182, the movement may either be slowed to a slower forward movement 178 or slowed down and reversed to a backward movement 180, for example.

FIG. 2 illustrates a schematic cross section of a semiconductor wafer grinding system 200. The semiconductor wafer grinding system comprises a wafer carrier structure 210 configured to hold a semiconductor wafer 202. The semiconductor wafer grinding system further comprises a grinding wheel 220 for grinding the semiconductor wafer 202. The grinding wheel 220 comprises a grinding material structure comprising a plurality of grinding stones embedded in a bonding material. At least 80% (or at least 85%, at least 90%, at least 95%) of grinding stones of the plurality of grinding stones comprise a diameter of more than 25 µm (or more than 30 µm, more 40 µm, more than 50 µm) and the plurality of grinding stones occupy more than 40% (or more than 50%, more than 60%, more than 65%) of the grinding material structure.

Grinding of semiconductor wafers with a stronger crystal structure than silicon, e.g. silicon carbide (SiC) semiconductor wafers may lead to a higher wear out of grinding wheels compared to silicon semiconductor wafers in other systems. Using grinding stones having a diameter larger than 25 µm may reduce a wear of the grinding wheel while grinding of semiconductor wafers having a stronger crystal structure, e.g. silicon carbide-based semiconductor wafers.

For example, the semiconductor carrier structure may comprise a chuck, chuck table, or chuck spindle. For example, the semiconductor wafer may be bonded to the semiconductor carrier structure, e.g. using one or more adhesive layers or foils. For example, the semiconductor wafer may be a wide band-gap semiconductor wafer, e.g. a silicon carbide-based semiconductor wafer.

For example, the grinding wheel may comprise a circular plane or a ring comprising the grinding material structure, e.g. on a side of the grinding wheel facing the semiconductor wafer. For example, the bonding material may comprise a metal or synthetic material (e.g. a plastic). For example, the grinding material structure may comprise the plurality of grinding stones bonded by the bonding material.

For example, grinding stones of the plurality of grinding stones may comprise at least one of diamond, silicon carbide (SiC) and corundum ($Al_2O_3$). Sufficiently hard materials may enable a grinding with a reduced wear on the grinding stones. For example, the at least 80% of the grinding stones of the plurality of grinding stones may comprise a diameter of less than 125 μm (or less than 120 μm, less than 100 μm, less than 90 μm, less than 80 μm). Grinding stores with a higher diameter may lead to deeper micro cracks, for example. For example, the plurality of grinding stones may occupy less than 90% (or less than 80%, less than 75%, less than 70%) or the grinding material structure, e.g. of a surface of the grinding material structure facing the semiconductor wafer.

For example, the semiconductor wafer grinding system may comprise an apparatus for controlling a movement of a grinding wheel of a semiconductor wafer grinding system as described in connection with FIG. 1a. The apparatus may enable using a feedback signal to adjust the grinding may enable adjusting the force applied to the semiconductor wafer, e.g. to enable grinding of semiconductor wafers having a stronger crystal structure while avoiding deep micro cracks.

More details and aspects of the semiconductor wafer grinding system 200 are mentioned in connection with the proposed concept or one or more examples described above or below (e.g. FIG. 1a or 3). The semiconductor wafer grinding system 200 may comprise one or more additional optional features corresponding to one or more aspects of the proposed concept or one or more examples described above or below.

FIG. 3 illustrates a flow chart of a method 300 for forming semiconductor devices. The method comprises grinding 310 of a backside of a semiconductor wafer with a grinding wheel during a first time interval. The grinding wheel is forward moved during the first time interval. A plurality of semiconductor devices are formed on the semiconductor wafer. The method further comprises polishing 320 of the backside of the semiconductor wafer with the grinding wheel in a second time interval. The grinding wheel is backward moved during the second time interval. The method further comprises dicing 330 the semiconductor wafer to separate the plurality of semiconductor devices from each other without additional polishing of the backside of the semiconductor wafer (e.g. after the polishing with the grinding wheel) and before dicing the semiconductor wafer.

Grinding and polishing the semiconductor wafer using the same grinding wheel may render additional polishing, e.g. using a different grinding/polishing wheel of a different machine unnecessary, and may save processing time and space during processing of the semiconductor wafer.

The method may further comprise attaching the semiconductor wafer to a wafer carrier structure. An elastic foil may be located between the semiconductor wafer and the wafer carrier structure. The elastic foil may be compressed to a compress thickness during grinding 310 of the backside of the semiconductor wafer. The elastic foil may return to its original thickness during the backward movement of the grinding wheel during polishing 320 of the backside of the semiconductor wafer. The elastic foil may push the semiconductor wafer towards the grinding wheel during polishing 320 of the backside of the semiconductor wafer. For example, the elastic foil may cause a contact of the semiconductor wafer with the grinding wheel. the compressed thickness of the elastic foil may be at least 20% smaller (or at least 30% smaller, at least 40% smaller, at least 50% smaller) than the original thickness of the elastic foil.

For example, the grinding 310 of the backside of the semiconductor wafer may comprise a first portion for grinding to a first larger semiconductor wafer thickness and a second portion for grinding to a second smaller semiconductor wafer thickness, e.g. based on a desired velocity profile. The grinding 310 may comprise a faster (forward) movement velocity for the first portion of the grinding and a slower (forward) movement velocity for the second portion of the grinding 310. The polishing 320 may be triggered after a target semiconductor wafer thickness is reached, for example. For example, the grinding 310 and/or the polishing 320 may be based on a desired velocity profile. For example, the desired velocity profile may comprise a first portion with a velocity above an average profile velocity for a coarse grinding towards the target semiconductor wafer thickness followed by a second portion with a velocity below an average profile velocity for a fine grinding towards the target semiconductor wafer thickness.

For example, the grinding wheel may comprise a grinding material structure comprising a plurality of grinding stones embedded in a bonding material. At least 80% of grinding stones of the plurality of grinding stones may comprise a diameter of more than 25 μm and the plurality of grinding stones may occupy more than of 40% of the grinding material structure.

For example, the movement of the grinding wheel during grinding 310 or polishing 320 may be based on a feedback signal comprising grinding force information indicating a force applied to a semiconductor wafer by the grinding wheel. A movement velocity for the grinding wheel may be applied according to a desired velocity profile during grinding 310 or polishing 320 of the semiconductor wafer if the grinding force information indicates that a force applied by the grinding wheel is below a force threshold. A movement velocity for the grinding wheel slower than the desired velocity profile during grinding 310 or polishing 320 of the semiconductor wafer may be applied if the grinding force information indicates that the force applied by the grinding wheel is above the force threshold.

The method may further comprise backside metallization of the semiconductor wafer, for example. The method may further comprise packaging of the plurality of semiconductor devices, for example. For example, the grinding 310 and the polishing 320 may be performed by the same semiconductor wafer grinding system. The grinding 310 and the polishing 320 may be performed by the same grinding wheel.

For example, a thickness of the semiconductor wafer after grinding may be smaller than 200 μm (or smaller than 150 μm, smaller than 100 μm, smaller than 80 μm, smaller than 70 μm, smaller than 60 μm, smaller than 50 μm). A thinner semiconductor wafer may enable a more efficient stacking or packaging of semiconductor devices. For example, an average roughness ($R_a$) may after polishing may be smaller than 60 nm (or smaller than 50 nm, smaller than 40 nm, smaller than 30 nm, smaller than 20 nm, smaller than 10 nm) and/or larger than 1 nm (or larger than 2 nm, larger than 3 nm, larger than 5 nm, larger than 10 nm). For example, a mean roughness depth ($R_z$) after polishing may be smaller than 200 nm (or smaller than 100 nm, smaller than 80 nm, smaller than 50 nm, smaller than 40 nm, smaller than 30 nm). For example, the semiconductor wafer may comprise a wide band-gap semiconductor material. For example, the semiconductor wafer may be a wide band gap semiconductor wafer having a band gap larger than the band gap of silicon (1.1 eV). For example, the semiconductor wafer may be a silicon carbide (SiC)(-based) semiconductor wafer, or gallium arsenide (GaAs)-based semiconductor wafer, or a gallium nitride (GaN)-based semiconductor wafer. Using a silicon carbide-based wafer may entail improved thermal properties of the semiconductor wafer.

For example, each semiconductor device of the plurality of semiconductor devices may comprise at least one electrical element structure comprising a blocking voltage of more than 10V. A high blocking voltage may enable a usage of the semiconductor devices in power device applications. For example, the electrical element structure may control and/or conduct and/or block a current flow between the front side of the semiconductor device and a backside of the semiconductor device. For example, the at least one electrical element structure may comprise a transistor structure or a diode structure. The at least one electrical element structure may comprise a breakdown voltage of more than 10V, e.g. more than 20V, more than 50V, more than 100V, for example. The semiconductor devices may be power semiconductor devices. A power semiconductor device and/or the at least one electrical element structure of the power semiconductor devices may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

More details and aspects of the method 300 for forming of semiconductor devices are mentioned in connection with the proposed concept or one or more examples described above or below (e.g. FIG. 1a or 2). The method 300 for forming of semiconductor devices may comprise one or more additional optional features corresponding to one or more aspects of the proposed concept or one or more examples described above or below.

At least some embodiments may provide a method for thinning of a silicon carbide wafer by grinding and polishing at one step. Non-silicon based semiconductor wafers, e.g. silicon carbide, may be difficult and very expensive at the thinning process by typical grinding and polishing machines. Moreover, in many aspects, processing might be different from standard silicon wafers to proceed. Due to the much stronger crystal structure of those wafers, these materials might not reach the typical process ability like silicon wafers and might become very expensive by grinding due to more wear out of the grinding wheel.

In other systems, with the standard compositions of grinding wheel diamonds and their bonding together, a higher process cost may be created when handling of those wafers is similar to silicon wafers.

At least some embodiments may be based on using a combination of the so called standard grinding process with its continuous forward moving grinding wheel with an additional imitated force on the wafer and/or grinding spindle motor current to get a feedback from the grinding and a possibility to move backward with the grinding wheel to reduce the force on the wafer, e.g. similar to polishing machines For example, the grinding force information may be based on an imitated/limited force on the wafer.

At least some embodiments may be based on using relatively rough diamonds with a strong bonding together. Those grinding stones might in other systems be used for hard metal like steel, chrome, nickel, molybdenum etc., but not for silicon due to the usually deep micro cracks. Those grinding stones may typically comprise 30 to 100 µm size of diamonds. The concentration of this diamonds on the grinding stone might also be higher than usual, e.g. up to 70% in the bonding.

The grinding itself may comprise a usual forward moving of the wheel to achieve a grinding with moderate heat influence on the wafer and a little bit of the necessary wheel wear loss of the wheel. Before the target thickness is reached, the forward moving of the wheel may be reduced to get a smooth surface like a polished one. Additionally (and finally) a soft grinding may be used, e.g. without wear out of the wheel to observe. In this mode is the possibility of backward moving of the wheel absolutely necessary, if the grinding wheel spindle motor current or the force on the wafer is reached a certain level. For example, a surface like polished may be achievable. For example, a single spindle grinding machine with special software (e.g. the apparatus according to FIG. 1a) may be all you need, which may help reduce a space required for production and reduce an amount of grinding wheels required.

One possible implementation may be done by software on existing grinding machines. Other systems may enable tracking of the motor current, which may be used for monitoring the grinding. This sensor may be considered for the grinding parameters (e.g. to supply the feedback signal) to do an adjustment of the movement of the grinding wheel. The modification may be implemented by a supplier of semiconductor wafer grinding systems.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming semiconductor devices, the method comprising:
   grinding a backside of a semiconductor wafer with a grinding wheel during a first time interval, wherein the grinding wheel is forward moved during the first time interval, wherein a plurality of semiconductor devices are formed on the semiconductor wafer;
   polishing the backside of the semiconductor wafer with the grinding wheel in a second time interval, wherein the grinding wheel is backward moved during the second time interval; and
   dicing the semiconductor wafer to separate the plurality of semiconductor devices from each other without additional polishing of the backside of the semiconductor wafer before dicing the semiconductor wafer.

2. The method of claim 1, further comprising:
   attaching the semiconductor wafer to a wafer carrier structure; and
   placing an elastic foil between the semiconductor wafer and the wafer carrier structure,
   wherein the elastic foil is compressed to a compressed thickness during grinding of the backside of the semiconductor wafer,
   wherein the elastic foil returns to its original thickness during the backward movement of the grinding wheel during polishing of the backside of the semiconductor wafer.

3. The method of claim 1, wherein the semiconductor wafer is a silicon carbide wafer.

4. The method of claim 1, wherein a thickness of the semiconductor wafer after the grinding is smaller than 200 µm.

5. The method of claim 1, wherein each semiconductor device of the plurality of semiconductor devices comprises at least one electrical element structure having a blocking voltage of more than 10V.

6. The method of claim 1, further comprising:
   obtaining a feedback signal comprising grinding force information indicating a force applied to the semiconductor wafer by the grinding wheel;
   generating a control signal for controlling the movement of the grinding wheel based on the grinding force information;
   triggering, based on the control signal, a forward movement of the grinding wheel according to a desired velocity profile during the first time interval if the grinding force information indicates that a force applied by the grinding wheel is below a force threshold; and
   triggering, based on the control signal, a movement of the grinding wheel slower than the desired velocity profile during the first time interval if the grinding force information indicates that the force applied by the grinding wheel is above the force threshold.

7. The method of claim 6, further comprising:
   triggering, based on the control signal, a backward movement of the grinding wheel during the first time interval if the grinding force information indicates that the force applied by the grinding wheel remains above the force threshold after slowing.

8. The method of claim 7, wherein the desired velocity profile is based on a target semiconductor wafer thickness.

9. The method of claim 8, wherein the desired velocity profile comprises a first portion with a velocity above an average profile velocity for a coarse grinding towards the target semiconductor wafer thickness and a second portion with a velocity below an average profile velocity for a fine grinding towards the target semiconductor wafer thickness.

10. The method of claim 9, wherein the velocity for the coarse grinding is at least 50% higher than the velocity for the fine grinding.

11. The method of claim 7, further comprising:
triggering, based on the control signal, the backward movement of the grinding wheel after a target semiconductor wafer thickness is reached.

12. The method of claim 6, wherein the grinding force information comprises information related to a motor current of a motor driving the grinding wheel.

13. The method of claim 6, wherein the grinding force information comprises information related to a pressure exerted from the grinding wheel to the semiconductor wafer.

14. The method of claim 1, wherein a velocity of the backward movement during the second time interval is slower than 50% of an average velocity of the desired velocity profile during the first time interval.

15. A method for thinning a semiconductor wafer, the method comprising:
obtaining a feedback signal comprising grinding force information indicating a force applied to the semiconductor wafer by a grinding wheel;
generating a control signal for controlling movement of the grinding wheel based on the grinding force information;
triggering, based on the control signal, a forward movement of the grinding wheel according to a desired velocity profile during grinding of the semiconductor wafer if the grinding force information indicates that a force applied by the grinding wheel is below a force threshold; and
triggering, based on the control signal, a movement of the grinding wheel slower than the desired velocity profile during grinding of the semiconductor wafer if the grinding force information indicates that the force applied by the grinding wheel is above the force threshold.

16. The method of claim 15, further comprising:
triggering, based on the control signal, a backward movement of the grinding wheel during grinding of the semiconductor wafer if the grinding force information indicates that the force applied by the grinding wheel remains above the force threshold after slowing the movement of the grinding wheel.

17. The method of claim 16, wherein the desired velocity profile comprises a first portion with a velocity above an average profile velocity for a coarse grinding towards a target semiconductor wafer thickness and a second portion with a velocity below an average profile velocity for a fine grinding towards the target semiconductor wafer thickness.

18. The method of claim 15, further comprising:
triggering, based on the control signal, backward movement of the grinding wheel after a target semiconductor wafer thickness is reached.

19. The method of claim 18, wherein the control signal is generated to trigger a polishing of the semiconductor wafer with the grinding wheel during the backward movement.

20. The method of claim 19, wherein a velocity of the backward movement during the polishing is slower than 50% of an average velocity of the desired velocity profile during the grinding.

* * * * *